United States Patent
Lee

(10) Patent No.: US 6,707,332 B1
(45) Date of Patent: Mar. 16, 2004

(54) CLOCK GENERATING CIRCUIT AND METHOD THEREOF

(75) Inventor: Yun-Kuo Lee, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 10/248,870

(22) Filed: Feb. 26, 2003

(30) Foreign Application Priority Data

Dec. 19, 2002 (TW) ........................................ 91136630 A

(51) Int. Cl.[7] .................................................. H03K 3/00
(52) U.S. Cl. ....................................................... 327/296
(58) Field of Search .......................... 327/99, 165, 170, 327/172, 291, 292, 295, 296, 339, 361, 407

(56) References Cited

U.S. PATENT DOCUMENTS 6,466,074 B2 * 10/2002 Vakil et al. ................. 327/295
6,466,075 B2 * 10/2002 Douchi et al. .............. 327/296
6,570,428 B1 * 5/2003 Liao et al. ................... 327/291
6,639,442 B1 * 10/2003 Ghameshlu et al. ........ 327/293

* cited by examiner

*Primary Examiner*—My-Trang Nu Ton
(74) *Attorney, Agent, or Firm*—Jianq Chyun IP Office

(57) ABSTRACT

A clock generating circuit and method thereof is provided. The frequency ratio between the output clock and the system clock is calculated as that the first preset value divides by the second preset value. A data value is stored into a register. The sum of the data value and the first preset value is calculated as a first result by the first adder. The sum of the first result and the second preset value is calculated as a second result by the second adder. A multiplexer (MUX) is used to select the data value that should be stored into the register at next system clock from the first result and the second result according to the level of the output clock. The first result is compared with a reference value by the first comparator to generate the output clock, so that the frequency of the output clock can be changed arbitrarily and it is not required to redesign the circuit.

24 Claims, 4 Drawing Sheets

CLOCK GENERATING CIRCUIT AND METHOD THEREOF

CROSS REFERENCE TO RELATED APPLICATIONS

The application claims the priority benefit of Taiwan application serial no. 91136630, filed Dec. 19, 2002.

BACKGROUND OF INVENTION

1. Field of Invention

The present invention generally relates to a clock generating circuit, and more particularly, to a clock generating circuit in which the frequency of the output clock can be arbitrarily changed and a method thereof.

2. Description of Related Art

Besides the system clock provided by the system itself, other clocks with frequency different from the system clock are also frequently used in the electronic circuit system. When the required frequency of the clock is an integer times of the frequency of the system clock, the function can be solely achieved by the divider. However, it is common that the required frequency of the clock is not right at an integer times of the frequency of the system clock, e.g. the 115.2 KHz used by the serial port and the 44.1 KHz used by the audio encoding and decoding. In such a case, the $2^n$ divider can not achieve the required function.

Therefore, the only way to implement it is using the method of the phase lock loop (PLL) or the state machine. However, the frequency ratio between the required clock and the system clock generated by the method of either PLL or the state machine is fixed after the design is completed. When the frequency of the system clock or the required clock is changed, the circuit is required to be redesigned and time and cost waste occur.

SUMMARY OF INVENTION

To solve the problem mentioned above, a clock generating circuit and a method thereof are provided by the present invention. It is not required to redesign the circuit when the frequency of the system clock or the required clock is changed, so that the frequency of the output clock generated can be arbitrarily changed according to the frequency ratio between the system clock and the required output clock.

In order to achieve the object mentioned above and others, the present invention provides a clock generating circuit. The clock generating circuit is suitable for generating a first output clock from a system clock, wherein the frequency ratio between the first output clock and the system clock is a value of the first preset value divided by the second preset value. The clock generating circuit comprises a register, a first adder, a first comparator, a second adder, and a multiplexer.

The register temporality stores a data value according to a trigger from the system clock. The first adder coupled to the register is used to receive the data value mentioned above and obtain a sum of the data value and the first preset value so as to output a first result. The first comparator coupled to the first adder is used to compare the first result with a reference value so as to generate a required first output clock. The second adder coupled to the first adder is used to receive the first result and obtain a sum of the first result and the second preset value so as to output a second result. The multiplexer couples to the first adder, the second adder, the first comparator, and the register. The multiplexer is used to select the data value that should be stored into the register at next system clock from the first result and the second result according to the level of the first output clock.

In an embodiment of the present invention, the magnitude of the first preset value and the second preset value is a value of the frequency of the first output clock and the frequency of the system clock divided by a GCF (Greatest Common Factor) of the frequency of the first output clock and the frequency of the system clock, respectively, so that the circuit design can be simplified.

In an embodiment of the present invention, a positive first preset value is input into the first adder, and a negative second preset value is input into the second adder. When the system is reset, the initial data value is set to 0, and the reference value is set to equal the second preset value. Each time when the first result is not smaller than the reference value, the first comparator generates a pulse of the first output clock. Moreover, each time when the pulsed is generated, the multiplexer selects the second result as the data value that should be stored into the register at next system clock.

In the other embodiment of the present invention, a negative first preset value is input into the first adder, and a positive second preset value is input into the second adder. When the system is reset, the initial data value is set to equal the second preset value, and the reference value is set to 0. Each time when the first result is not greater than 0, the first comparator generates a pulse of the first output clock. Moreover, each time when the pulse is generated, the multiplexer selects the second result as the data value that should be stored into the register at next system clock.

In either embodiment of the present invention, the clock generating circuit further comprises a second comparator. The second comparator coupled to the register is used to compare the data value with a third preset value that is smaller than the second preset value, so as to generate a second output clock. Preferably, the third preset value is a rounded integer of a half of the second preset value, so as to adjust the duty of the output clock.

The present invention further provides a clock generating method. The clock generating method is suitable for generating a first output clock from a system clock. Wherein, the frequency ratio between the first output clock and the system clock is a value of the first preset value divided by the second preset value. The clock generating method comprises the steps of: first, obtaining a sum of a data value and the first preset value so as to generate a first result; obtaining a sum of the first result and the second preset value so as to generate a second result; selecting a data value that should be stored into the register at next system clock from the first result and the second result according to the level of the first output clock; and comparing the first result with a reference value so as to generate a first output clock.

Preferably, the magnitude of the first preset value and the second preset value is a value of the frequency of the first output clock and the frequency of the system clock divided by a GCF of the frequency of the first output clock and the frequency of the system clock, respectively.

Wherein, when obtaining the first result and the second result, a positive first preset value and a negative second preset value are used to obtain the summation. Moreover, the initial data value is set to 0, and the reference value is set to equal the second preset value. Each time when the first result is not smaller than the reference value, a pulse of the first output clock is generated. Furthermore, each time when the pulsed is generated, the second result is selected as the data value that should be stored into the register at next system clock.

Wherein, when obtaining the first result and the second result, a negative first preset value and a positive second preset value are used to obtain the summation. Moreover, the initial data value is set to the second preset value, and the reference value is set to 0. Each time when the first result is not greater than 0, a pulse of the first output clock is generated. Furthermore, each time when the pulse is generated, the second result is selected as the data value that should be stored into the register at next system clock.

A step of comparing the data value with a third preset value that is smaller than the second preset value so as to generate a second output clock is further comprised. Preferably, the third preset value is a rounded integer of a half of the second preset value.

From descriptions mentioned above, with the clock generating circuit and the method thereof of the present invention, the frequency of the output clock generated can be arbitrarily changed according to the frequency ratio between the system clock and the required clock when the frequency of the system clock or the required clock is changed. Therefore, It is not required to redesign the circuit and the time and cost waste can be eliminated.

BRIEF DESCRIPTION OF DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a diagram of a clock generating circuit of the first embodiment according to the present invention.

DETAILED DESCRIPTION

First Embodiment

Figure 1:
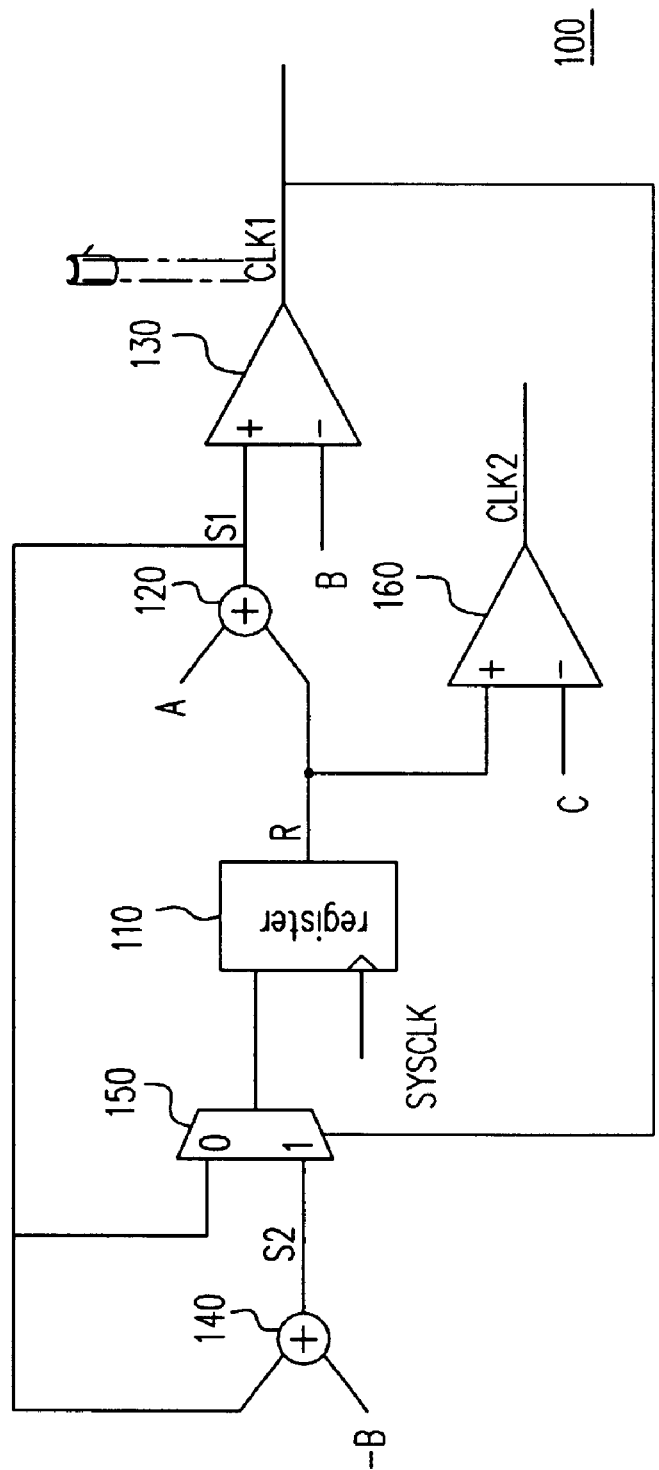

FIG. 1 schematically shows a diagram of a clock generating circuit of the first embodiment according to the present invention. The clock generating circuit 100 comprises a register 110, a first adder 120, a first comparator 130, a second adder 140, and a multiplexer 150. As shown in the diagram, preferably, the clock generating circuit 100 further comprises a second comparator 160 so as to adjust the duty of the output clock that is generated.

It is assumed that the frequency of the system clock SYSCLK is 34 MHz, and the frequency of the first output clock CLK1 or the second output clock CLK2 that is to be generated is 10 MHz, thus the frequency ratio between the first output clock CLK1 and the system clock SYSCLK is 10M/34M. For simplifying the circuit, a GCF of the frequency of the first output clock CLK1 and the system clock SYSCLK is obtained first. Then, the first preset value A and the second preset value B is set as a value of the frequency of the first output clock CLK1 and the frequency of the system clock SYSCLK divided by the GCF 2M, respectively. In this case, the first preset value A and the second preset value B are 5 and 17, respectively.

Moreover, in order to adjust the duty of the output clock that is generated, a third preset value C referred to by the second comparator is setup, and the third preset value should be smaller than the second preset value B. Here, in order to generate a second output clock CLK2 that is a rounded average duty, the third preset value C is set as a rounded integer value of a half of the second preset value, i.e. C=INT (17/2)=8.

As shown in the diagram, the register 110 temporarily stores a data value R that is a calculation result of the first adder 120 or the second adder 140 according to a trigger from the system clock SYSCLK. The first adder 120 gradually increases the data value R by a first preset value A, so as to output a first result S1. The second adder 140 calculates a difference between the first result S1 and the second preset value B, so as to output a second result S2. The first comparator 130 compares the first result S1 with a reference value that equals the second preset value B, and generates a pulse of the first output clock CLK1 to obtain the first output clock CLK1 that is required when the first result S1 is not smaller than the second preset value B.

Furthermore, when the pulse of the first output clock CLK1 is generated, that means the first result S1 incremented gradually by the data value R has been greater or equal to the second preset value B, thus the multiplexer 150 selects the second result S2 as the data value R that should be stored into the register 110 at next system clock. In other words, the data value R is incremented gradually by the first preset value A, and when it is greater or equal to the second preset value, its value is stopped from incrementing. Instead, its value is replaced by a second result S2 that is used as the data value R and is the result of the second preset value B subtracted from the increased first result S1, so as to maintain a result of generating A number of pulses of the first output clock CLK1 per B number of pulses of the system clock SYSCLK. The second comparator 160 is set to output a second output clock CLK2 with high level (or reverse) when the data value R is greater than the third preset value C. Conversely, the second output clock CLK2 with low level (or reverse) is output so as to adjust its duty. The waveform physically generated is described in detail with reference to FIG. 2.

Figure 2:
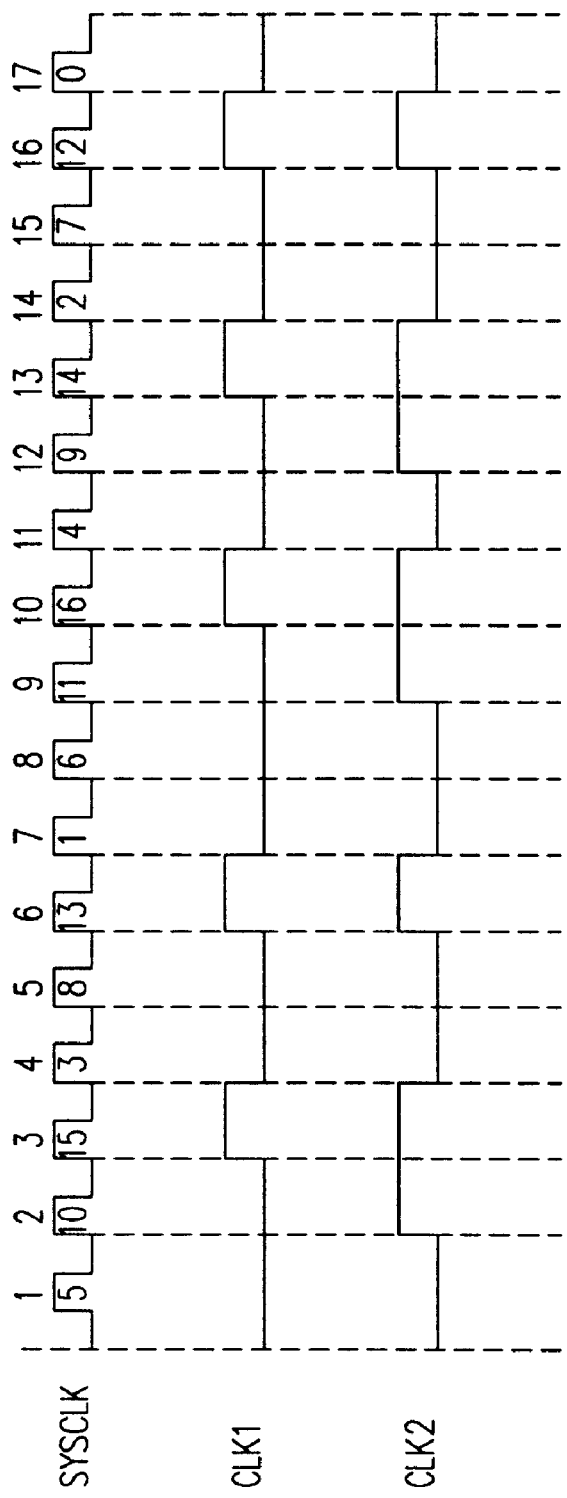
FIG. 2 schematically shows a diagram of a clock waveform sequence of the first embodiment according to the present invention.

In FIG. 2, since the output clock of the present embodiment requires generating 5 pulses per 17 system clocks SYSCLK, the sequence waveform of only the 17 system clocks SYSCLK is shown in the diagram. As shown in the diagram, when the system is initialized, the data value R stored in the register 110 is set to 0, and the first preset value A=5 starts to be used for increasing the data value R.

At the 2nd clock, the data value R is increased to 10 that is greater than 8, thus the second output clock CLK2 turns to high level. At the 3rd clock, the data value R is increased to 15, meanwhile the first result S1=20 that is greater than 17, thus the first comparator 130 outputs a pulse of the first output clock CLK1. At the 4th clock, the multiplexer 150 selects the second result S2, and subtracts 17 from the first result S1 so as to obtain a data value R=3, thus the second output clock CLK2 turns to low level.

At the 6th clock, the data value R is increased to 13 that is greater than 8, thus the second output clock CLK2 turns to high level again. Meanwhile, the first result S1=18 that is greater than 17, thus the first comparator 130 outputs a pulse of the first output clock CLK1. At the 7th clock, the multiplexer 150 selects the second result S2, and subtracts 17 from the first result S1 so as to obtain the data value R=1, thus the second output clock CLK2 turns to low level.

At the 9th clock, the data value R is increased to 11 that is greater than 8, thus the second output clock CLK2 turns to high level again. At the 10th clock, the data value R is increased to 16, meanwhile the first result S1=21 that is greater than 17, thus the first comparator 130 outputs a pulse of the first output clock CLK1. At the 11th clock, the multiplexer 150 selects the second result S2, and subtracts 17 from the first result S1 so as to obtain the data value R=4, thus the second output clock CLK2 turns to low level.

At the 12th clock, the data value R is increased to 9 that is greater than 8, thus the second output clock CLK2 turns to high level again. At the 13th clock, the data value R is increased to 14, meanwhile the first result S1=19 that is greater than 17, thus the first comparator 130 outputs a pulse of the first output clock CLK1. At the 14th clock, the multiplexer 150 selects the second result S2, and subtracts 17 from the first result S1 so as to obtain the data value R=2, thus the second output clock CLK2 turns to low level.

At the 16th clock, the data value R is increased to 12 that is greater than 8, thus the second output clock CLK2 turns to high level again. Meanwhile, the first result S1=17, thus the first comparator 130 outputs a pulse of the first output clock CLK1. At the 17th clock, the multiplexer 150 selects the second result S2, and subtracts 17 from the first result S1 so as to obtain the data value R=0, thus the second output clock CLK2 turns to low level and goes back to the initial state.

From descriptions mentioned above, with the same way, the first output clock CLK1 and the second output clock CLK2 with 5 pulses are generated per 17 system clocks SYSCLK. Moreover, when the frequency ratio between the output clock and the system clock SYSCLK is getting bigger, the frequency of the first output clock CLK1 and the second output clock CLK2 will approach to accurate values. Furthermore, the duty of the second output clock CLK2 also approaches more average and its error is also minimized.

Second Embodiment

Figure 3:
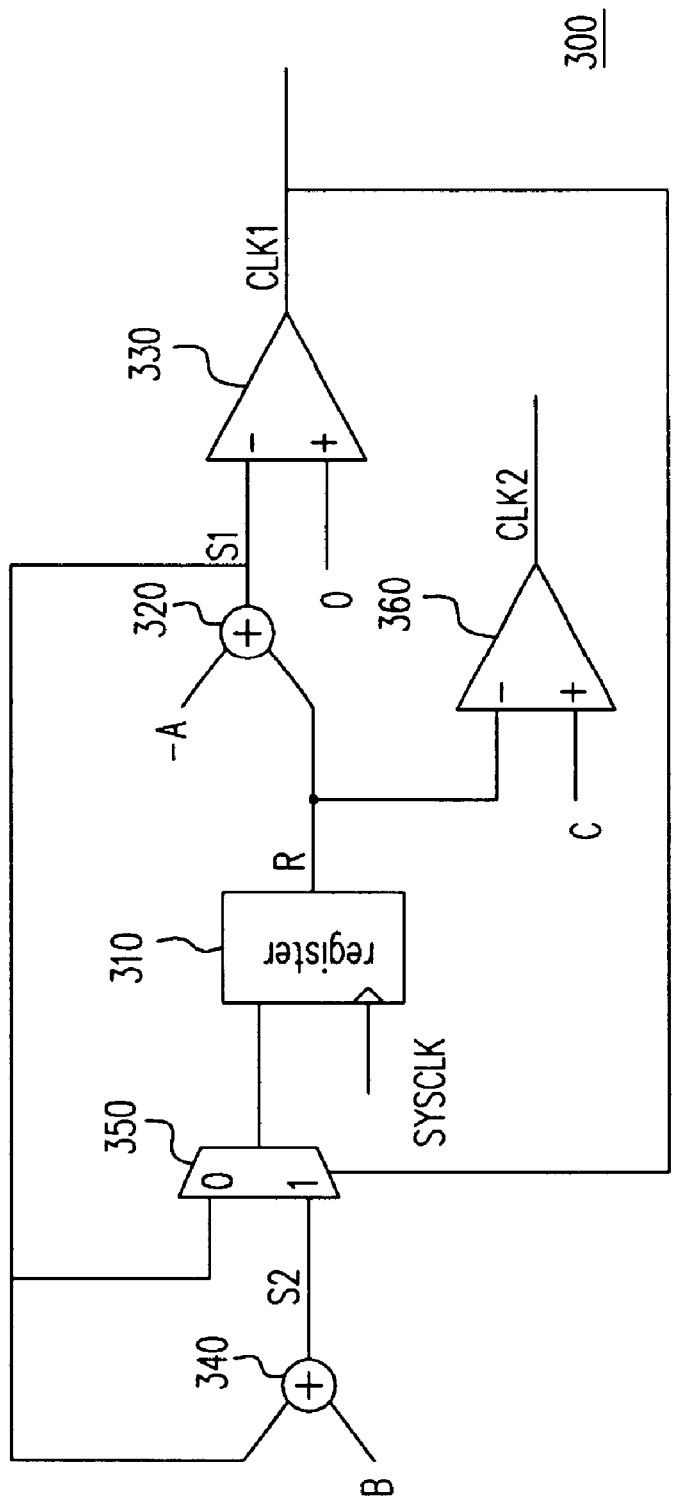
FIG. 3 schematically shows a diagram of a clock generating circuit of the second embodiment according to the present invention.

FIG. 3 schematically shows a diagram of a clock generating circuit of the second embodiment according to the present invention. The difference between the present embodiment and the first embodiment is the first embodiment uses a method of increasing the data value, whereas the present embodiment uses a method of decreasing the data value. As shown in the diagram, the clock generating circuit 300 also comprises a register 310, a first adder 320, a first comparator 330, a second adder 340, and a multiplexer 350. As shown in the diagram, preferably, the clock generating circuit 300 further comprises a second comparator 360 so as to adjust the duty of the output clock that is generated.

The assumptions used in the description regarding the system clock SYSCLK, the first output clock CLK1 and the second output clock CLK2 of the first embodiment are still valid here. That is, the first preset value A and the second preset value B are 5 and 17, respectively. Moreover, the third preset value C is set as a rounded integer value of a half of the second preset value, i.e. C=INT (17/2)=8.

As shown in the diagram, the register 310 temporarily stores a data value R that is a calculation result of the first adder 320 or the second adder 340 according to a trigger from the system clock SYSCLK. The first adder 320 gradually decreases the data value R by a first preset value A, so as to output a first result S1. The second adder 340 calculates a sum of the first result S1 and the second preset value B, so as to output a second result S2. The first comparator 330 compares the first result S1 with a reference value that equals 0, and generates a pulse of the first output clock CLK1 to obtain the first output clock CLK1 that is required when the first result S1 is not greater than 0.

Furthermore, when the pulse of the first output clock CLK1 is generated, that means the first result S1 decreased gradually by the data value R has been smaller or equal to 0, thus the multiplexer 350 selects the second result S2 as the data value R that should be stored into the register 310 at next system clock. In other words, the data value R is decreased gradually by the first preset value A, and when it is smaller or equal to 0, its value is stopped from decreasing. Instead, its value is replaced by a second result S2 that is used as the data value R and is the result of the second preset value B added to the decreased first result S1, so as to maintain a result of generating A number of pulses of the first output clock CLK1 per B number of pulses of the system clock SYSCLK. The second comparator 360 is set to output a second output clock CLK2 with high level (or reverse) when the data value R is smaller than the third preset value C. Conversely, the second output clock CLK2 with low level (or reverse) is output so as to adjust its duty. The waveform physically generated is described in detail with reference to FIG. 4.

Figure 4:
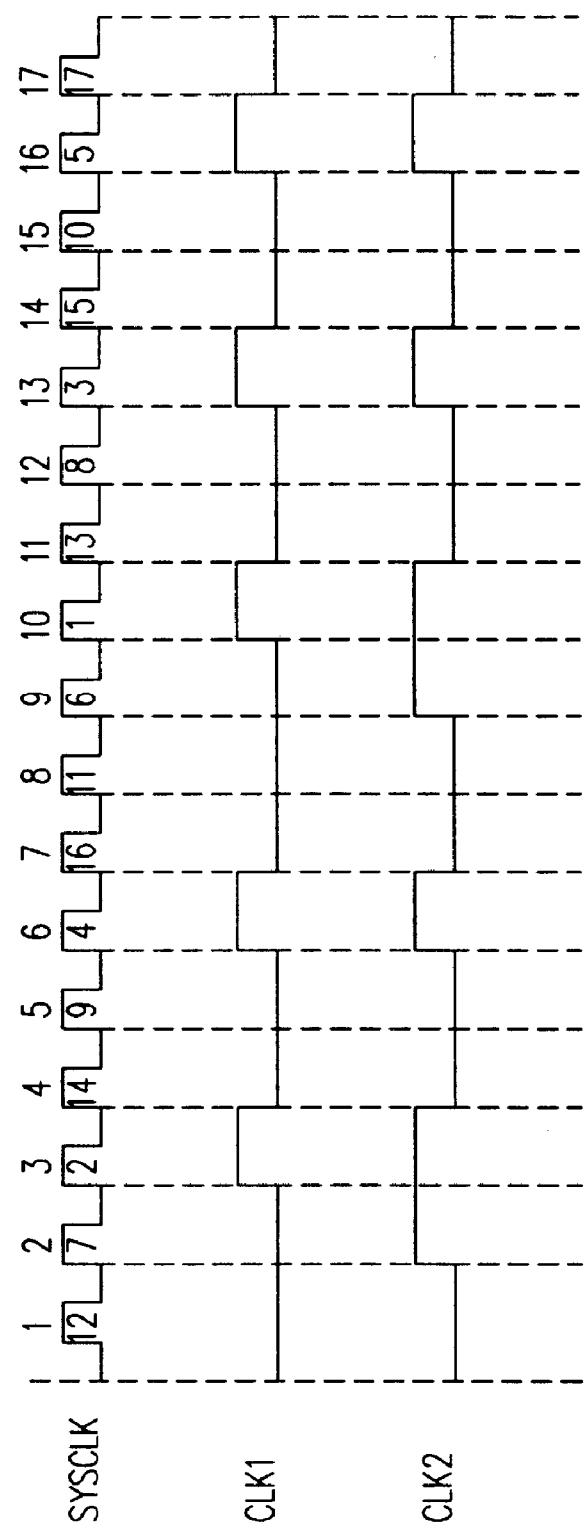
FIG. 4 schematically shows a diagram of a clock waveform sequence of the second embodiment according to the present invention.

In FIG. 4, since the output clock of the present embodiment requires generating 5 pulses per 17 system clocks SYSCLK, the sequence waveform of only the 17 system clocks SYSCLK is shown in the diagram. As shown in the diagram, when the system is initialized, the data value R stored in the register 310 is set to equal the second preset value B=17, and the first preset value A=5 starts to be used for decreasing the data value R.

At the 2nd clock, the data value R is decreased to 7 that is smaller than 8, thus the second output clock CLK2 turns to high level. At the 3rd clock, the data value R is decreased to 2, meanwhile the first result S1=−3 that is smaller than 0, thus the first comparator 330 outputs a pulse of the first output clock CLK1. At the 4th clock, the multiplexer 350 selects the second result S2, and adds 17 to the first result S1 so as to obtain a data value R=14, thus the second output clock CLK2 turns to low level.

At the 6th clock, the data value R is decreased to 4 that is smaller than 8, thus the second output clock CLK2 turns to high level again. Meanwhile, the first result S1=−1 that is smaller than 0, thus the first comparator 330 outputs a pulse of the first output clock CLK1. At the 7th clock, the multiplexer 350 selects the second result S2, and adds 17 to the first result S1 so as to obtain the data value R=16, thus the second output clock CLK2 turns to low level.

At the 9th clock, the data value R is decreased to 6 that is smaller than 8, thus the second output clock CLK2 turns to high level again. At the 10th clock, the data value R is decreased to 1, meanwhile the first result S1=−4 that is smaller than 0, thus the first comparator 330 outputs a pulse of the first output clock CLK1. At the 11th clock, the multiplexer 350 selects the second result S2, and adds 17 to the first result S1 so as to obtain the data value R=13, thus the second output clock CLK2 turns to low level.

At the 13th clock, the data value R is decreased to 3 that is smaller than 8, thus the second output clock CLK2 turns to high level again. Meanwhile, the first result S1=−2 that is smaller than 0, thus the first comparator 330 outputs a pulse of the first output clock CLK1. At the 14th clock, the multiplexer 350 selects the second result S2, and adds 17 to the first result S1 so as to obtain the data value R=15, thus the second output clock CLK2 turns to low level.

At the 16th clock, the data value R is decreased to 5 that is smaller than 8, thus the second output clock CLK2 turns to high level again. Meanwhile, the first result S1=0, thus the first comparator 330 outputs a pulse of the first output clock CLK1. At the 17th clock, the multiplexer 350 selects the second result S2, and adds 17 to the first result S1 so as to obtain the data value R=17, thus the second output clock CLK2 turns to low level and backs to the initial state.

From the descriptions mentioned above, in the same way, the first output clock CLK1 and the second output clock CLK2 with 5 pulses are generated per 17 system clocks SYSCLK. Moreover, as the frequency ratio between the output clock and the system clock SYSCLK is getting bigger, the frequency of the first output clock CLK1 and the second output clock CLK2 approaches to accurate values. Furthermore, the duty of the second output clock CLK2 also approaches more average and its error is also minimized.

In summary, a clock generating method is concluded. The method is suitable for generating a first output clock from a system clock, wherein the frequency ratio between the first output clock and the system clock is a value of the first preset value divided by the second preset value, and the clock generating method comprises the steps of: at first, obtaining a sum of a data value and the first preset value so as to generate a first result; obtaining a sum of the first result and the second preset value so as to generate a second result; selecting a data value that should be stored into a register at a next system clock from the first result and the second result according to the level of the first output clock; and comparing the first result with a reference value so as to generate the first output clock.

Wherein, the magnitude of the first preset value A and the second preset value B is a value of the frequency of the first output clock CLK1 and the frequency of the system clock SYSCLK divided by a GCF (Greatest Common Factor) of the frequency of the first output clock CLK1 and the frequency of the system clock SYSCLK, respectively.

Wherein, when obtaining the first result S1 and the second result S2, a positive first preset value A and a negative second preset value B are used to obtain its summation. Moreover, the initial data value is set to 0, and the reference value equals the second preset value. Each time when the first result S1 is not smaller than the reference value, a pulse of the first output clock CLK1 is generated. Moreover, each time when the pulse is generated, the second result S2 is selected as the data value R that should be stored into the register at next system clock.

Wherein, when obtaining the first result S1 and the second result S2, a negative first preset value A and a positive second preset value B are used to obtain its summation. Moreover, the initial data value R is set to equal the second preset value B, and the reference value equals 0. Each time when the first result is not greater than 0, a pulse of the first output clock CLK1 is generated. Moreover, each time when the pulse is generated, the second result S2 is selected as the data value R that should be stored into the register at next system clock.

Wherein, in order to adjust the duty of the output clock, the present invention further comprises a step of comparing the data value R with a third preset value C that is smaller than the second preset value B, so as to generate a second output clock CLK2. Preferably, the third value C is a rounded integer value of a half of the second preset value B.

In summary, the present invention at least has the following advantages:
1. When the frequency of the system clock or the frequency of the required output clock is changed, the frequency of the required output clock can be obtained by only synchronously modifying the setting of the first preset value, the second preset value, the third preset value, and the reference value according to the frequency ratio between the system clock and the required output clock. Therefore, it is very convenient.
2. It is not required to redesign the circuit and the time and cost waste can be eliminated when the frequency of the system clock or the required clock is changed.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A clock generating circuit, suitable for generating a first output clock from a system clock, wherein a frequency ratio between the first output clock and the system clock is a value of a first preset value divided by a second preset value, and the clock generating circuit comprises:

a register, used to temporarily store a data value according to a trigger of the system clock;

a first adder, coupled to the register, used to receive the data value and obtain a sum of the data value and the first preset value, so as to output a first result;

a first comparator, coupled to the first adder, used to compare the first result with a reference value, so as to generate a first output clock;

a second adder, coupled to the first adder, used to receive the first result and obtain a sum of the first result and the second preset value, so as to output a second result; and a multiplexer, coupled to the first adder, the second adder, the first comparator, and the register, used to select the data value that should be stored into the register from the first result and the second result at the next system clock according to the level of the first output clock.

2. The clock generating circuit of claim 1, wherein the magnitude of the first preset value and the second preset value is a value of the frequency of the first output clock and the frequency of the system clock divided by a GCF (Greatest Common Factor) of the frequency of the first output clock and the frequency of the system clock, respectively.

3. The clock generating circuit of claim 1, wherein a positive first preset value is input into the first adder, and a negative second preset value is input into the second adder.

4. The clock generating circuit of claim 3, wherein when the system is reset, the initial data value is set to 0.

5. The clock generating circuit of claim 3, wherein the reference value equals the second preset value, and each time when the first result is not smaller than the reference value, the first comparator generates a pulse of the first output clock.

6. The clock generating circuit of claim 5, wherein each time when the pulse is generated, the multiplexer selects the second result as the data value that should be stored into the register at the next system clock.

7. The clock generating circuit of claim 1, wherein a negative first preset value is input into the first adder, and a positive second preset value is input into the second adder.

8. The clock generating circuit of claim 7, wherein when the system is reset, the initial data value is set to equal the second preset value.

9. The clock generating circuit of claim 7, wherein the reference value equals 0, and each time when the first result is not greater than 0, the first comparator generates a pulse of the first output clock.

10. The clock generating circuit of claim 9, wherein each time when the pulse is generated, the multiplexer selects the second result as the data value that should be stored into the register at the next system clock.

11. The clock generating circuit of claim 1, further comprising a second comparator, wherein the second comparator is coupled to the register and is used to compare the data value with a third preset value that is smaller than the second preset value, so as to generate a second output clock.

12. The clock generating circuit of claim 11, wherein the third value is a rounded integer value of a half of the second preset value.

13. A clock generating method, suitable for generating a first output clock from a system clock, wherein the frequency ratio between the first output clock and the system clock is a value of the first preset value divided by the second preset value, and the clock generating method comprises the steps of:

obtaining a sum of a data value and the first preset value so as to generate a first result;

obtaining a sum of the first result and the second preset value so as to generate a second result;

selecting a data value that should be stored into a register at a next system clock from the first result and the second result according to the level of the first output clock; and comparing the first result with a reference value so as to generate the first output clock.

14. The clock generating method of claim 13, wherein the magnitude of the first preset value and the second preset value is a value of the frequency of the first output clock and the frequency of the system clock divided by a GCF (Greatest Common Factor) of the frequency of the first output clock and the frequency of the system clock, respectively.

15. The clock generating method of claim 13, wherein when obtaining the first result and the second result, a positive first preset value and a negative second preset value are used to obtain its summation.

16. The clock generating method of claim 15, wherein the initial data value is 0.

17. The clock generating method of claim 15, wherein the reference value equals the second preset value, and each time when the first result is not smaller than the reference value, a pulse of the first output clock is generated.

18. The clock generating method of claim 17, wherein each time when the pulse is generated, the second result is selected as the data value that should be stored into the register at the next system clock.

19. The clock generating method of claim 13, wherein when obtaining the first result and the second result, a negative first preset value and a positive second preset value are used to obtain its summation.

20. The clock generating method of claim 19, wherein the initial data value is set to equal the second preset value.

21. The clock generating method of claim 19, wherein the reference value equals 0, and each time when the first result is not greater than 0, a pulse of the first output clock is generated.

22. The clock generating method of claim 21, wherein each time when the pulse is generated, the second result is selected as the data value that should be stored into the register at the next system clock.

23. The clock generating method of claim 13, further comprises a step of comparing the data value with a third preset value that is smaller than the second preset value, so as to generate a second output clock.

24. The clock generating method of claim 23, wherein the third value is a rounded integer value of a half of the second preset value.

* * * * *